(12) United States Patent
Gleener

(10) Patent No.: US 6,400,336 B1
(45) Date of Patent: Jun. 4, 2002

(54) TUNABLE DUAL BAND ANTENNA SYSTEM

(75) Inventor: Andrey Gleener, Burnaby (CA)

(73) Assignee: Sierra Wireless, Inc., Richmond (CA)

( * ) Notice: Subject to any disclaimer, the term of this patent is extended or adjusted under 35 U.S.C. 154(b) by 0 days.

(21) Appl. No.: 09/864,614

(22) Filed: May 23, 2001

(51) Int. Cl.[7] .............................................. H01Q 1/50
(52) U.S. Cl. ...................................... 343/860; 343/745
(58) Field of Search .............................. 343/702, 745, 343/850, 860, 861; H01Q 1/50

(56) References Cited

U.S. PATENT DOCUMENTS

| | | | | |
|---|---|---|---|---|
| 3,725,942 A | * | 4/1973 | Ukmar | 343/715 |
| 5,867,127 A | * | 2/1999 | Black et al. | 343/702 |
| 6,067,052 A | * | 5/2000 | Rawles et al. | 343/741 |
| 6,094,178 A | * | 7/2000 | Sanford | 343/895 |
| 6,188,364 B1 | * | 2/2001 | Scordilis | 343/702 |
| 6,285,331 B1 | * | 9/2001 | Jesman et al. | 343/713 |

* cited by examiner

*Primary Examiner*—Tho Phan
(74) *Attorney, Agent, or Firm*—Burns, Doane, Swecker & Mathis LLP

(57) ABSTRACT

A tunable dual band antenna system is disclosed. The system includes a transceiver, a matching network and an antenna. The matching network is operable to tune the antenna to the transceiver at both a first and second frequency. Accordingly, the matching network has a variable capacitor, an inductor and a second capacitor. The value of the variable capacitor is chosen to tune the antenna at the first frequency and the second frequency such that the system can be used to transmit and receive electromagnetic energy over two bandwidths. The values of the variable capacitor, the inductor, and the second capacitor are chosen to minimize the standing wave ratio of the system at both the first frequency and the second frequency.

17 Claims, 2 Drawing Sheets

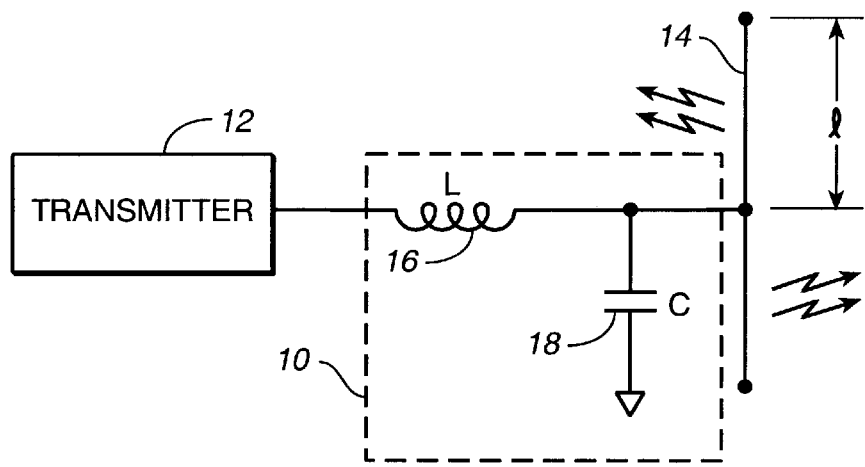
FIG._1
*(PRIOR ART)*
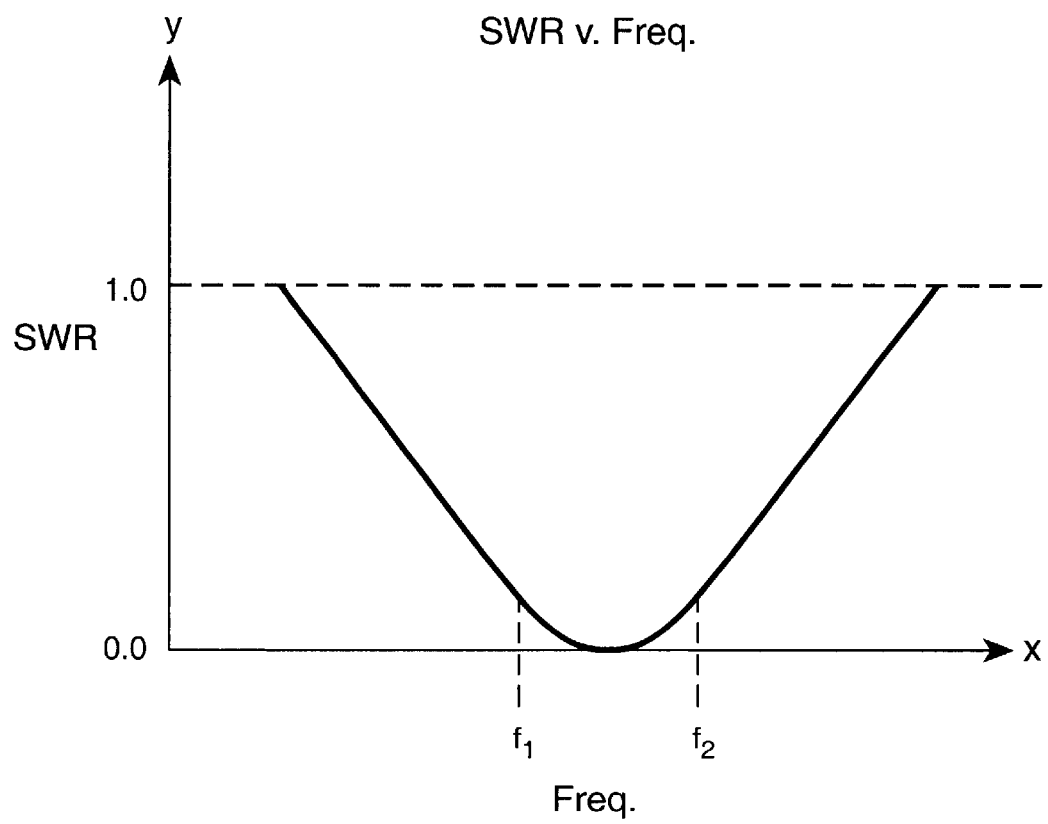
FIG._2
*(PRIOR ART)*

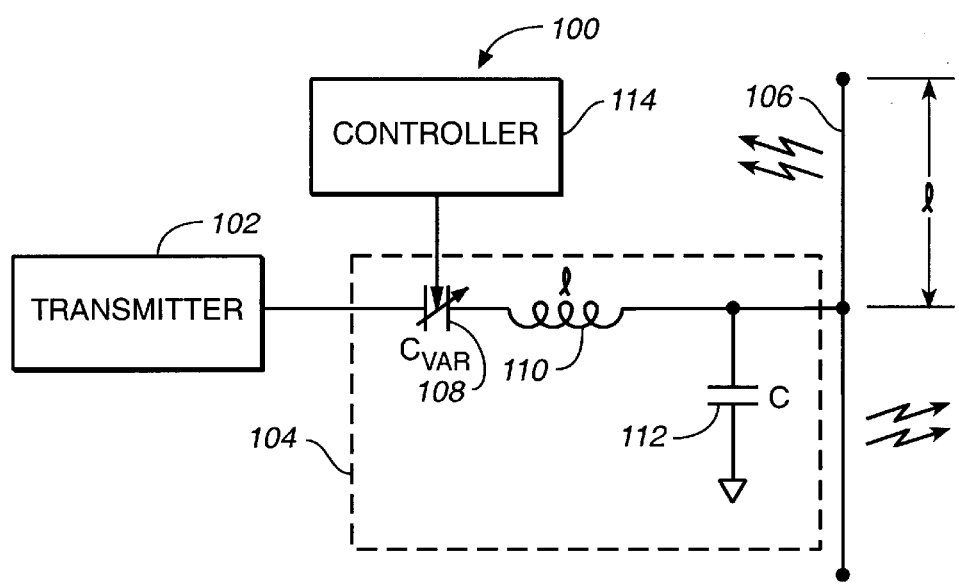
FIG._3
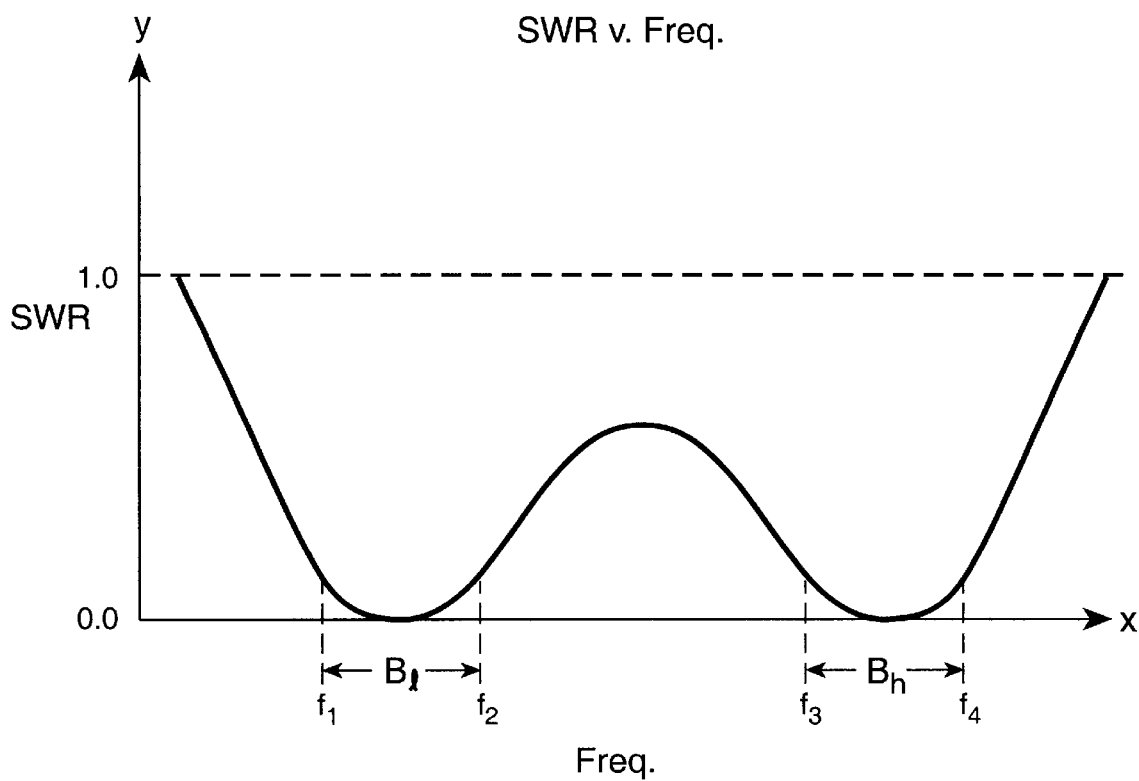
FIG._4

TUNABLE DUAL BAND ANTENNA SYSTEM

FIELD OF THE INVENTION

The present invention relates generally to matching networks for antennas and more particularly to a matching network for a tunable dual band antenna.

STATUS OF PRIOR ART

In order to assure the maximum transfer of energy from a radio frequency (RF) transmitter to an antenna, the impedances between the antenna and the transmitter for the frequency of transmission should be matched. If the impedances match, then the antenna will transmit at the maximum efficiency. However, if the impedances do not match, then transmission energy is lost and the performance of the antenna is decreased.

To match the impedance between the transmitter and the antenna, a matching network is provided. For a common dipole antenna, the matching network will match the impedance of the dipole antenna to the impedance of the transmitter. Referring to FIG. 1, a prior art matching network 10 for a transmitter 12 and a dipole antenna 14 is shown. The transmitter 10 generates a RF signal which is to be propagated by the dipole antenna 12 having a length l. Typically, the length l is determined from the wavelength $\lambda$ of the signal to be propagated. For instance, the length of the dipole antenna may be $\frac{1}{4}\lambda$, $\frac{1}{2}\lambda$ or $\frac{3}{4}\lambda$.

The prior art matching network 10 includes an inductor 16 having a first lead connected to the output of the transmitter 12. Furthermore, the matching network 10 includes a capacitor 18 connected between a second lead of the inductor 16 and ground. Additionally, the second lead of the inductor 16 is connected to the dipole antenna 14. In this respect, the inductor 16 and the capacitor 18 form a LC network which can match the impedance between the transmitter 12 and the dipole antenna 14 for a prescribed frequency by choosing the values of the capacitor 18 and inductor 16.

The transmitter 12 will generate a RF signal within a prescribed frequency band. The matching network 10 provides an impedance match between the transmitter 12 and the antenna 14 within this prescribed frequency band. The values of the inductor 16 and the capacitor 18 are chosen for the correct impedance matching at the desired frequency bandwidth. By varying the values of the inductor 16 and the capacitor 18 it is possible to tune the matching network 10 and hence the antenna 14 to transmit within the prescribed frequency bandwidth.

Referring to FIG. 2, the relationship between the amount of energy transmitted and the frequency of the signal being propogated for the prior art matching network 10 is shown. Specifically, the voltage standing wave ratio (SWR) for the signal propogated with antenna 14 connected to the prior art matching network 10 and the transmitter 12 of FIG. 1 is shown. As is evident, the antenna 14 will transmit efficiently between the frequencies of $f_1$ and $f_2$ where the SWR is at a minimum. However, outside of this band, the SWR increases such that the antenna 14 does not transmit the signal efficiently and a majority of the signal is returned. As such, the propagation of energy from the transmitter 12 is efficient only between the values of $f_1$ and $f_2$.

Accordingly, a difficulty arises with the prior art matching network 10 in the sense that it can only be tuned for a single prescribed bandwidth. For instance, the values of the capacitor 18 and inductor 16 must be chosen for a single frequency bandwidth between $f_1$ and $f_2$ such that efficient energy transfer will not occur outside of that frequency bandwidth.

Currently, wireless phones are capable of transmitting on two different frequency bands. For example, the first frequency band may be between 824–895 MHZ (i.e, a low band) and the second frequency band may be between 1.85–1.99 Ghz (i.e., a high band). In order to transmit on both the low band and the high band, the antenna must efficiently transmit signals generated within both frequency bands. However, as previously mentioned, the prior art matching network 10 with dipole antenna 14 is only capable of efficiently transmitting within a single frequency band. As such, for a dual band transmission scheme alternative methods for transmitting the signal must be used.

Specifically, three-dimensional antennas are used to transmit signals over dual bands. The three-dimensional antennas are physically bulky and clumsy to use. For instance, for dual band wireless phones, the housing of the wireless phone is designed around the physical structure of the three-dimensional antenna. However, this is not practical where the wireless device is embodied as a plug-in peripheral card (i.e., PCMCIA Card) for a computer or a PDA. The size of the card results in it being physically impossible to use a three-dimensional antenna.

Alternatively, two antennas for each frequency bandwidth may be utilized. Each of the antennas would be configured to transmit signals in either the high band or the low band. For proper operation, both of the antennas would be connected to a frequency switch which would direct the signals to the correct antenna. For example, the switch would direct low bandwidth signals to the antenna configured for low band signals, while the switch would direct high bandwidth signals to the antenna configured for high band signals. However, the dual antennas and frequency switch add size and complexity to the wireless phone. The antennas would use twice as much space as a single antenna, and the frequency switch would add cost and complexity to the system. Accordingly, the use of dual antennas would be disfavored in wireless devices adapted to be plugged into a computer or PDA.

The present invention addresses the above-mentioned deficiencies in the design of dual band antenna systems by providing a matching network that can use a single dipole antenna for two frequency bandwidths. Specifically, the matching network of the present invention enables a single dipole antenna to efficiently transmit signals over two frequency bands thereby decreasing the size and complexity of dual bandwidth antenna systems.

BRIEF SUMMARY OF THE INVENTION

In accordance with the present invention, there is provided a tunable dual band antenna system for use with a high frequency bandwidth and a low frequency bandwidth. The system includes a transceiver and a matching network electrically connected to the transceiver. It will be recognized that the transceiver may be a transmitter or a receiver without affecting the functionality of the system. The system further includes an antenna electrically connected to the matching network. Typically, the length of the antenna is about $\frac{1}{4}$ of the length of the lowest wavelength of the first and second frequencies. The matching network is operable to match the impedance of the antenna and the transceiver at a first frequency and a second frequency. The matching network includes a variable capacitor, a second capacitor and an inductor which are operative to tune the matching network for the transceiver and the antenna at the first and second frequencies.

In the preferred embodiment, the variable capacitor is operative to tune the antenna to a first frequency bandwidth centered on the first frequency and a second frequency bandwidth centered on the second frequency. A controller may be provided which varies the capacitance of the variable capacitor in order to tune for the first and second frequencies. As will be recognized, the values of the variable capacitor, the inductor, and the second capacitor are chosen such that the voltage standing wave ratio (SWR) for the system is at a minimum at the locations of the first frequency and the second frequency.

In accordance with the present invention, there is provided a matching network for an antenna and a transceiver. The matching network includes an inductor electrically connected to the antenna and a capacitor in electrical communication with the inductor and a ground potential. The system further includes a variable capacitor in electrical communication with the inductor and the transceiver. The variable capacitor is operative to match the impedance of the transceiver to the antenna at both a first frequency and a second frequency. Accordingly, the variable capacitor has a first capacitance value corresponding to the first frequency to be tuned and a second capacitance value corresponding to the second frequency to be tuned. The first and second capacitance values are chosen to minimize the standing wave ratio of the system at the first frequency and the second frequency.

BRIEF DESCRIPTION OF THE DRAWINGS

These, as well as other features of the present invention, will become more apparent upon reference to the drawings wherein:

FIG. 1 is circuit diagram of a prior art antenna matching network and antenna;

FIG. 2 is a graph illustrating the relationship between the Standing Wave Ratio (SWR) versus Frequency for the antenna and prior art matching network shown in FIG. 1;

FIG. 3 is a circuit diagram of an antenna matching network and antenna constructed in accordance with the present invention; and FIG. 4 is a graph illustrating the relationship between the SWR versus Frequency for the antenna and matching network shown in FIG. 2.

DETAILED DESCRIPTION OF THE INVENTION

Referring now to the drawings wherein the showings are for purposes of illustrating a preferred embodiment of the present invention only, and not for purposes of limiting the same, FIG. 3 is a circuit diagram for a dual band antenna system 100. The antenna system 100 has a transceiver 102 electrically connected to a matching network 104. It will be recognized by those of ordinary skill in the art that the transceiver 100 may also be a receiver or a transmitter depending upon the specific application. The matching network 104 is connected to a dipole antenna 106 having a length 1, as seen in FIG. 3. The length l is typically ¼ of the length of the wavelength for the lower bandwidth. The matching network 104 provides impedance matching between the antenna 106 and the transceiver 102 for two prescribed frequency bandwidths.

Specifically, referring to FIG. 3, the matching network 104 has a variable capacitor 108 with a first lead electrically connected to the transceiver 102. A second lead of the variable capacitor 108 is electrically connected to a first lead of an inductor 110. A second lead of the inductor 110 is electrically connected to the antenna 106 and a second capacitor 112. Specifically, the second capacitor 112 has a first lead connected between the antenna 106 and the inductor 110, and a second lead connected to ground as seen in FIG. 3.

The matching network 104 provides impedance matching between the antenna 106 and the transceiver 102 for two frequency bandwidths. By including the variable capacitor 108 it is possible to tune the antenna system 100 for a high bandwidth $B_h$ and a low bandwidth $B_l$. In the preferred embodiment, the value of the capacitor 108 is chosen at the time of production depending upon the two bandwidths that are being used. Alternatively, it is contemplated that the variable capacitor 108 may be under the direction of a controller 114. Specifically, the controller 114 may vary the capacitance of the variable capacitor 108 in response to the frequency that is being transmitted and/or received. The values of the variable capacitor 108, as well as inductor 110 and capacitor 112 are determined to achieve efficient transmission of the signal from the transceiver 102 at the center of both the high bandwidth $B_h$ and the low bandwidth $B_l$.

Referring to FIG. 4, the relationship between the SWR for the antenna system 100 and frequency is shown. As can be seen, there are two minimums of the SWR located at the centers of the low bandwidth $B_l$ and the high bandwidth $B_h$. Accordingly, efficient energy transmission occurs between $f_1$ and $f_2$ and between $f_3$ and $f_4$. At other frequencies, the standing wave ratio (SWR) increases to a point that the inefficient transfer of energy from the transceiver 102 to the antenna 106 occurs. In wireless communications devices, the low bandwidth $B_l$ may be between about 824–895 MHZ and the high bandwidth $B_h$ may be between about 1.85–1.99 GHz. It will be recognized that the values of the low and high bandwidths $B_l$ and $B_h$ may vary depending on the type of application such that the values of the variable capacitor 108, inductor 110, and capacitor 112 will be chosen accordingly.

It will be recognized that the present invention provides a tunable dual band antenna system which can be physically realized in a small package. A standard dipole antenna 106 can be used for the transmission of signals. Additionally, the matching network 104 only needs one extra component (i.e., variable capacitor 108) in order to tune the system 100 for dual bands. Accordingly, the antenna system 100 is ideally suited for wireless applications that are size restricted such as wireless modems for PCMCIA and PC cards.

In order for the antenna system 100 to operate, the values of the $B_l$ and $B_h$ must first be chosen. Specifically, the frequency bandwidths $B_l$ and $B_h$ of the two signals to be transmitted and received by the system 100 must be known. Once the bandwidths are known, the values of variable capacitor 108, inductor 110 and second capacitor 112 are chosen according to current methods known in the art for impedance matching. As previously mentioned, the values of the variable capacitor 108, the inductor 110 and the second capacitor 112 are chosen to minimize the SWR at both Band $B_h$.

The system 100 operates by receiving a signal via the antenna 106. The impedance of the signal received by the antenna 106 is matched to the transceiver 102 via the matching network 104 such that all of the energy of the signal is received by the transceiver 102, as previously mentioned. Similarly, in a transmitting mode, the system 100 operates by the transceiver 102 generating a signal to the matching network 104 which in turn matches the impedance of the signal to the antenna 106. In this sense, the matching network 104 ensures that the signal is efficiently transmitted if the frequency of the signal falls between $B_l$ or $B_h$.

Additional modifications and improvements of the present invention may also be apparent to those of ordinary skill in the art such as using a different type of antenna structure rather than a dipole antenna. Thus, the particular combination of parts described and illustrated herein is intended to represent only a certain embodiment of the present invention, and is not intended to serve as limitations of alternative devices within the spirit and scope of the invention.

What is claimed is:

1. A tunable dual band antenna system, the system comprising:

a transceiver;

a matching network electrically connected to the transceiver and having a controller operable to continuously vary the impedance of the matching network; and an antenna electrically connected to the matching network;

wherein the matching network is operable to match the impedance of the antenna and the transceiver at a first and second frequency.

2. The system of claim 1 wherein the matching network is operable to match the impedance of the transceiver for a first frequency bandwidth centered on the first frequency and a second frequency bandwidth centered on the second frequency.

3. The system of claim 1 wherein the matching network includes a first capacitor, a second capacitor and an inductor operative to tune the antenna for the first and second frequencies.

4. The system of claim 3 wherein the value of the first capacitor is chosen to enable the matching network to tune the first and second frequencies.

5. The system of claim 4 wherein the first capacitor is a variable capacitor operative to vary the capacitance thereof for the first and second frequencies.

6. The system of claim 5 wherein the matching network further includes a controller operative to vary the capacitance of the first capacitor.

7. The system of claim 6 wherein the values of the first capacitor, the inductor and the second capacitor are chosen to minimize the standing wave ratio of the system at both the first and second frequencies.

8. The system of claim 1 wherein the antenna has a length l that is equal to about ¼ the wavelength of the lowest of the first and second frequencies.

9. The system of claim 1 wherein the transceiver is a transmitter.

10. The system of claim 1 wherein the transceiver is a receiver.

11. A matching network for an antenna and a transceiver, the matching network comprising:

an inductor in electrical communication with the antenna;

a first capacitor in electrical communication with the inductor, the antenna and a ground potential;

a second capacitor in electrical communication with the inductor and the transceiver, the second capacitor being operative to match the impedance of the transceiver to the antenna at a first frequency and a second frequency; and a controller electrically connected to the second capacitor and being operative to continuously vary the capacitance thereof such that the controller can match the impedance between the antenna and the transceiver by varying the capacitance of the second capacitor.

12. The matching network of claim 11 wherein the second capacitor is a variable capacitor with a value chosen to match the impedance of the transceiver with the antenna at the first frequency and the second frequency.

13. The matching network of claim 12 further comprising a controller operative to vary the capacitance of the variable capacitor.

14. The matching network of claim 13 wherein the values of the variable capacitor, the inductor, and the capacitor are chosen to minimize the standing wave ratio between the transceiver and the antenna at both the first and second frequencies.

15. A method of performing efficient transmission of energy at a first frequency and a second frequency in an antenna system having a transceiver and an antenna, the method comprising the steps of:

a) providing a matching network with a controller;

b) minimizing the standing wave ratio for the system with the controller of the matching network at the first frequency; and c) minimizing the standing wave ratio for the system with the controller of the matching network at the second frequency.

16. The method of claim 15 wherein step (a) comprises providing a matching network having a first capacitor, an inductor and a second capacitor in order to minimize the SWR for the system at both the first frequency and the second frequency.

17. The method of claim 16 wherein step (a) further comprises choosing the values of the variable capacitor, the inductor, and the second capacitor to minimize the standing wave ratio at both the first and second frequencies.

* * * * *